(12) United States Patent
Gu et al.

(10) Patent No.: US 10,868,265 B2
(45) Date of Patent: Dec. 15, 2020

(54) BACK FILM FOR FLEXIBLE DISPLAY PANEL, FLEXIBLE DISPLAY PANEL AND FABRICATION METHOD THEREOF

(71) Applicant: BOE TECHNOLOGY GROUP CO., LTD., Beijing (CN)

(72) Inventors: Penghao Gu, Beijing (CN); Chunyan Xie, Beijing (CN); Pao Ming Tsai, Beijing (CN); Yongxiang Shi, Beijing (CN); Lingzhi Qian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/385,096

(22) Filed: Apr. 16, 2019

(65) Prior Publication Data

US 2020/0075872 A1 Mar. 5, 2020

(30) Foreign Application Priority Data

Aug. 30, 2018 (CN) .......................... 2018 1 1002807

(51) Int. Cl.
*H01L 51/00* (2006.01)
*B32B 7/12* (2006.01)
(Continued)

(52) U.S. Cl.
CPC ............ *H01L 51/0097* (2013.01); *B32B 7/12* (2013.01); *B32B 27/06* (2013.01); *B32B 27/20* (2013.01);
(Continued)

(58) Field of Classification Search
CPC .......... H01L 51/0097; H01L 2227/323; H01L 2251/5338; H01L 51/5253; H01L 23/5387;
(Continued)

(56) References Cited

U.S. PATENT DOCUMENTS

2014/0308494 A1* 10/2014 Iwaya ................. H01L 51/5253
428/216
2014/0367644 A1 12/2014 Song et al.
(Continued)

FOREIGN PATENT DOCUMENTS

| CN | 103097463 | 5/2013 |
| CN | 103228704 | 7/2013 |

(Continued)

OTHER PUBLICATIONS

Office Action dated Jan. 22, 2020 for Chinese Patent Application No. 201811002807.3.
(Continued)

*Primary Examiner* — Feifei Yeung Lopez
(74) *Attorney, Agent, or Firm* — Thomas | Horstemeyer LLP

(57) ABSTRACT

The present disclosure relates to the field of display panel technology. An embodiment of the present disclosure provides a back film for a flexible display panel, a flexible display panel and fabrication method thereof, where the back film comprises a base material having an elastic modulus of 6 to 10 GPa and a breaking elongation of 5% to 20%. An embodiment of the present disclosure is used in manufacture of the display panel.

15 Claims, 3 Drawing Sheets

(51) Int. Cl.
  *B32B 27/06* (2006.01)
  *B32B 27/20* (2006.01)
  *B32B 37/12* (2006.01)
  *H01L 27/32* (2006.01)
  *H01L 51/56* (2006.01)
  *H01L 51/52* (2006.01)
  *H01L 23/538* (2006.01)

(52) U.S. Cl.
  CPC .......... *B32B 37/12* (2013.01); *H01L 23/5387* (2013.01); *H01L 27/3244* (2013.01); *H01L 51/5253* (2013.01); *H01L 51/56* (2013.01); *B32B 2264/102* (2013.01); *B32B 2457/206* (2013.01); *H01L 2227/323* (2013.01); *H01L 2251/5338* (2013.01)

(58) Field of Classification Search
  CPC .......... B32B 7/12; B32B 27/06; B32B 27/20; B32B 37/12; B32B 2264/102; B32B 2457/206
  See application file for complete search history.

(56) References Cited

U.S. PATENT DOCUMENTS

| | | | | |
|---|---|---|---|---|
| 2015/0195915 | A1* | 7/2015 | Namkung | B32B 37/26 |
| | | | | 361/750 |
| 2017/0028677 | A1* | 2/2017 | Lee | B32B 27/283 |
| 2017/0168391 | A1* | 6/2017 | Yoshida | G03F 7/38 |

FOREIGN PATENT DOCUMENTS

| | | |
|---|---|---|
| CN | 106652802 | 5/2017 |
| CN | 107195252 | 9/2017 |
| CN | 107665854 | 2/2018 |
| JP | H1072531 | 3/1998 |
| JP | 2016102147 | 6/2016 |

OTHER PUBLICATIONS

2nd Office Action dated Jul. 30, 2020 for Chinese Patent Application No. 201811002807.3.

* cited by examiner

BACK FILM FOR FLEXIBLE DISPLAY PANEL, FLEXIBLE DISPLAY PANEL AND FABRICATION METHOD THEREOF

CROSS-REFERENCE TO RELATED APPLICATIONS

The present application is based on, and claims the benefit of and priority to, Chinese Patent Application No. 201811002807.3, filed on Aug. 30, 2018, the entire contents of which being hereby incorporated by reference herein.

FIELD OF THE INVENTION

The present disclosure relates to the technical field of display panel, and in particular, to a flexible display panel.

BACKGROUND

At present, flexible display panels are getting more and more people's attention due to their deformable and bendable characteristics, especially the Organic Light Emitting Display (OLED) which has gradually become the first choice for the display panel due to its many advantages. These advantages include self-luminous, high luminous efficiency, short response time, high definition, and high contrast characteristics.

The flexible display panel usually has a back film attached to the bottom for protection and support. Therefore, the back film is the thickest compared to other film layers, and the bending recovery performance, bending strength, and deformability of the thickest back film will directly affect the overall bending performance of the thinner film layer attached thereto.

Taking an OLED display panel as an example, the OLED display panel usually includes a film layer structure, such as a light emitting film layer, an array structure layer, a flexible substrate, and a back film. However, at present, a PET substrate is usually implemented on the back film of the OLED display panel, where the elastic modulus thereof is 2 to 3 Gpa, the bending strength is about 115 Mpa, the bending recovery performance and bending strength are poor, and the breaking elongation is large, close to 100%. Also, tensile deformation easily occurs and is unrecoverable. When the bending radius of an OLED display panel is small, cracking easily occurs.

BRIEF SUMMARY OF INVENTION

According to one aspect of the disclosure, an embodiment of the present disclosure provides a back film for a flexible display panel, where the back film comprises a base material having an elastic modulus of 6 to 10 GPa and a breaking elongation of 5% to 20%.

According to one of the embodiments of the present disclosure, the base material has an elastic modulus of 7 to 8 GPa.

According to one of the embodiments of the present disclosure, the base material includes at least one of a polyimide resin, a modified poly(ethylene terephthalate), a rubber, and a nylon.

According to one of the embodiments of the present disclosure, inorganic nanoparticles are dispersed in the back film.

According to one of the embodiments of the present disclosure, the inorganic nanoparticles in the back film have a mass fraction of 1% to 5%.

According to one of the embodiments of the present disclosure, the back film includes a bending zone and a non-bending zone, where inorganic nanoparticles are dispersed in the non-bending zone.

According to one of the embodiments of the present disclosure, the inorganic nanoparticles in the non-bending zone have a mass fraction of 1% to 5%.

According to one of the embodiments of the present disclosure, the inorganic nanoparticles include a mixture of one or more of silicon dioxide nanoparticles, titanium dioxide nanoparticles, and alumina oxide nanoparticles.

According to one of the embodiments of the present disclosure, a glue layer is formed on one surface of the back film.

According to one of the embodiments of the present disclosure, the glue layer is an acrylic pressure sensitive glue layer.

According to one of the embodiments of the present disclosure, the thickness of the glue layer is 10 μm to 30 μm.

According to one of the embodiments of the present disclosure, the back film for a flexible display panel further includes a release film provided on a surface of the glue layer.

According to one of the embodiments of the present disclosure, the base material has a moisture absorption rate of 2% or less.

According to another aspect of the present disclosure, the thickness of the back film is 20 μm to 70 μm.

According to another aspect of the disclosure, a flexible display panel is provided, including a back film, a flexible substrate layer, an array structure layer, a light emitting film layer, and an encapsulating film layer, which are arranged such that they are stacked sequentially. The back film includes a base material having an elastic modulus of 6 to 10 GPa and a breaking elongation of 5% to 20%.

According to one of the embodiments of the present disclosure, inorganic nanoparticles are dispersed in the back film.

According to one of the embodiments of the present disclosure, the flexible display panel is an OLED display panel.

According to another aspect of the disclosure, a method for fabricating a flexible display panel is provided which includes: fabricating an array structure layer on a flexible substrate layer, fabricating a light emitting film layer on the array structure layer, fabricating an encapsulating film layer on the light emitting film layer, and attaching a back film to a side of the flexible substrate layer away from the array structure layer.

According to one of the embodiments of the present disclosure, a method for fabricating a back film includes: mixing the high polymer material, the inorganic nanoparticles material, and the coupling agents; heating and stirring uniformly; and then molding.

BRIEF DESCRIPTION OF THE DRAWINGS

In order to more clearly illustrate the embodiments of the present disclosure or the technical solutions in the related art, the drawings to be used in the embodiments or the description of the related art will be briefly described below. Generally, the drawings in the following description are only some of the embodiments of the present disclosure, and those skilled in the art can obtain other drawings based on these drawings without any creative work.

DETAILED DESCRIPTION

Figure 1:
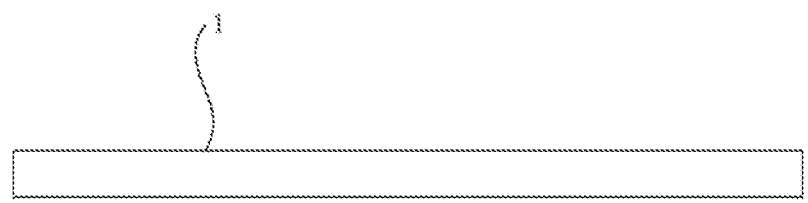
FIG. 1 is a schematic structural diagram of a back film according to an embodiment of the present disclosure.

The technical solutions in the embodiments of the present disclosure are clearly and completely described in the following with reference to the accompanying drawings in the embodiments of the present disclosure. It is apparent that the described embodiments are only a part of the embodiments of the present disclosure, and not all of the embodiments. All other embodiments obtained by a person of ordinary skill in the art based on the embodiments of the present disclosure without creative work are all within the scope of the disclosure.

In the description of the present disclosure, it is to be understood that orientation or positional relationship indicated by the terms, such as "center", "upper", "lower", "front", "back", "left", "right", "vertical", "horizontal", "top", "bottom", "inside", "outside", and the like, is based on the orientation or positional relationship shown in the drawings and is merely for the convenience of describing the present disclosure and simplifying the description, rather than indicating or implying that the device or component referred to must have a particular orientation or constructed and operated in a particular orientation, and, thus, it cannot be understood as a restriction on this disclosure. In the description of the present disclosure, "a plurality of" means two or more unless otherwise stated.

In one aspect, an embodiment of the present disclosure provides a back film for a flexible display panel. Referring to FIG. 1, the back film includes a base material, that is, the back film 1 is fabricated by the base material having an elastic modulus of 6 to 10 GPa and a breaking elongation of 5% to 20%.

The elastic modulus is a measure of ability of an object to resist elastic deformation. The larger the value, the greater the stress that causes the material to elastically deform will be. That is, the greater the rigidity of the material, the smaller the elastic deformation will be under a certain stress.

The breaking elongation is the ratio of the displacement value of the sample at the time of breaking to the original length of the sample, and is an indicator for measuring toughness. In general, the smaller the breaking elongation, the better the toughness of the material will be, and it is not easy to break when the bending radius is small. This makes the maximum stress that the material can withstand when it is broken under bending load or when it the specified deflection greater, that is, the bending strength is large.

For the organic polymer material, when the elastic modulus is 6-10 GPa and the breaking elongation is 5% to 20%, the bending strength of the material is usually 170 MPa or more.

The embodiment of the present disclosure provides a flexible display panel. Because the elastic modulus of the back film 1 is large and the breaking elongation is small, the back film 1 is not easily deformed, the recovery ability is strong after being bent, and both the bending strength and the deformability are strong, such that the bending recovery performance, the bending strength, and the deformability of the flexible display panel can be improved, and cracking can be prevented when the bending radius is small.

In one embodiment, the base material has an elastic modulus of 7 to 8 GPa.

In another embodiment of the present disclosure, the base material has a moisture absorption rate of 2% or less. Based on this, the back film 1 can also prevent moisture from entering and play a role of moisture-proof.

The base material may be a metal material, a resin material, or an alloy material that satisfies the above conditions.

In an embodiment of the present disclosure, the base material includes at least one of a polyimide resin, a modified poly terephthalate (PET), a rubber, and a nylon. The polyimide resin refers to a type of polymer containing an imide ring (—CO—NH—CO—) in the main chain, where the polymer containing a phthalimide structure is an important organic polymer material with notable comprehensive performance. PET material has the characteristics of hardness, good rigidity, high strength, notable toughness, small friction coefficient, and high dimensional stability, and is often used as engineering plastics. These materials are softer than metal materials and can be used to avoid scratching other layers or scratching the display panel when used in a flexible display screen.

The thickness of the back film 1 is not limited.

In another embodiment of the present disclosure, the thickness of the back film 1 is 20 µm to 70 µm. Because the back film has high bending recovery performance, bending strength, and deformability, when a bendable structure is fabricated, the thickness thereof can be reduced.

Figure 2:
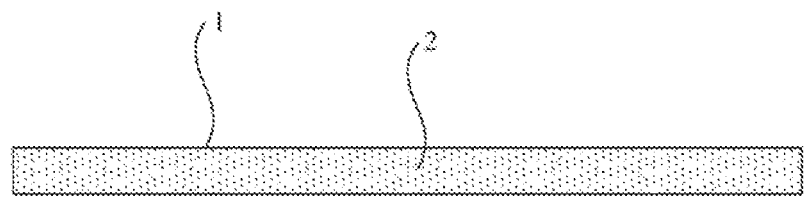
FIG. 2 is a schematic structural diagram of another back film according to an embodiment of the present disclosure.

It should be noted that, since the thickness of the base material satisfying the above conditions is reduced, it will be very soft. In order to ensure the flatness and support of the back film of the flexible base film, in one possible case, referring to FIG. 2, inorganic nanoparticles 2 are dispersed in the back film 1 of the base film layer. In this case, the inorganic nanoparticles 2 can improve the mechanical properties of the back film 1 of the base film layer, increase the stiffness and toughness, increase the rigidity of the back film 1 of the base film layer, further reduce the breaking elongation, while not affecting the bending recovery performance of the back film 1 of the base film layer.

In this possible case, the inorganic nanoparticles 2 in the back film 1 have a mass fraction of 1% to 5%. If the mass fraction of the inorganic nanoparticle 2 is too high, surface defects are likely to occur and the bending recovery performance of the back film 1 is affected. If the mass fraction is too low, it is disadvantageous for the improvement of the mechanical strength of the back film 1.

Figure 3:
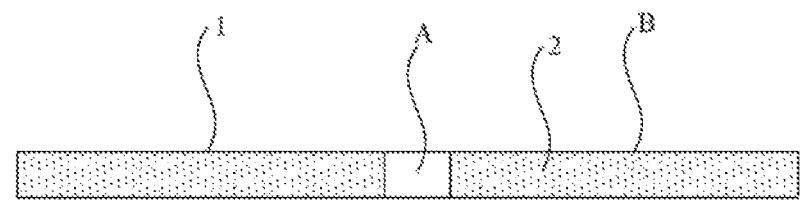
FIG. 3 is a schematic structural diagram of another back film according to an embodiment of the present disclosure.

In another possible case, referring to FIG. 3, the back film 1 includes a bending zone A and a non-bending zone B, where the inorganic nanoparticles 2 are dispersed in the non-bending zone B. In this case, the mechanical properties and rigidity of the non-bending zone B can be improved, the stiffness and toughness can be increased, the support and flatness requirements of the non-bending zone B can be satisfied, and, at the same time, the high bending recovery performance of the bending zone A can also be maintained.

In this possible case, the inorganic nanoparticles 2 in the non-bending zone B have a mass fraction of 1% to 5%. If the mass fraction of the inorganic nanoparticle 2 is too high, surface defects are likely to occur and the bending recovery performance of the non-bending zone is affected. If the mass fraction is too low, it is disadvantageous to the improvement of the mechanical strength of the non-bending zone B.

The specific components of the inorganic nanoparticles 2 are not limited as long as the mechanical strength of the back film 1 can be improved.

In one embodiment of the present disclosure, the inorganic nanoparticles 2 include a mixture of one or more of silicon dioxide nanoparticles, titanium dioxide nanoparticles, and alumina oxide nanoparticles. These nanoparticles contain a large amount of hydroxyl groups and have a large surface energy, and are easily bonded to the organic polymer material due to surface valence bond defect thereof.

Specifically, in the fabrication, the high polymer material and the inorganic nanoparticles may be placed together, stirred, or sonicated under heating, such that the inorganic nanoparticles are uniformly dispersed in the high polymer material during fabrication and molding.

In one embodiment, coupling agents may be added for bonding.

Figure 4:
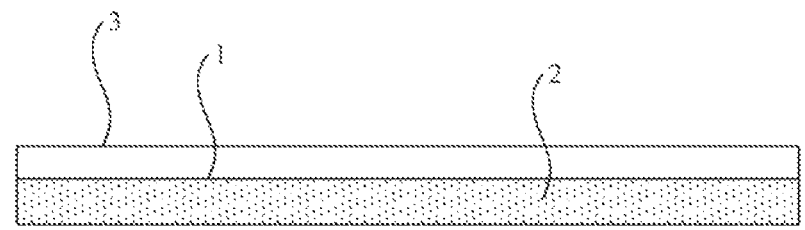
FIG. 4 is a schematic structural diagram of another back film according to an embodiment of the present disclosure.
Figure 5:
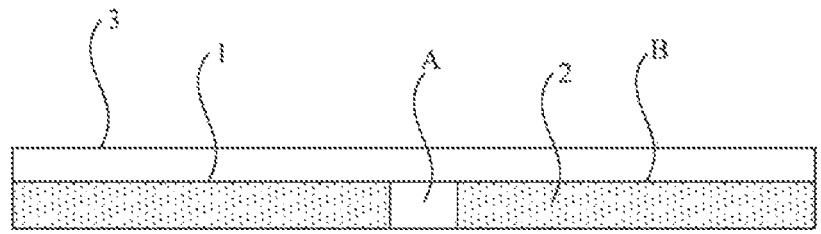
FIG. 5 is a schematic structural diagram of another back film according to an embodiment of the present disclosure.

In another embodiment of the present disclosure, referring to FIG. 4 and FIG. 5, a glue layer 3 is formed on one surface of the back film 1. The addition of the glue layer 3 is beneficial to the application of the back film 1.

In another embodiment of the present disclosure, the glue layer 3 is an acrylic pressure sensitive glue layer. The adhesion thereof is controlled above 1000 gf/Inch.

In one embodiment, the thickness of the glue layer 3 may be 10 µm to 30 µm.

Figure 6:
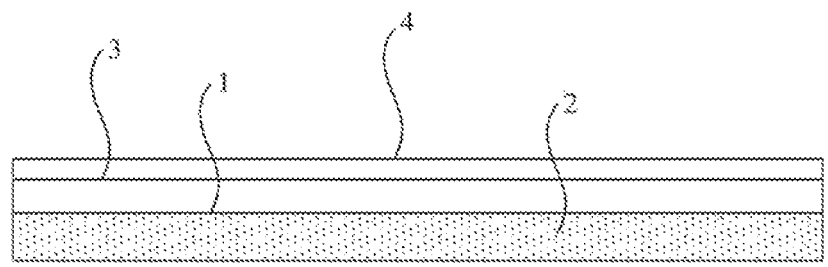
FIG. 6 is a schematic structural diagram of another back film according to an embodiment of the present disclosure.

Further, referring to FIG. 6, the back film 1 may further include a release film 4 provided on a surface of the glue layer 3. The glue layer 3 can be protected by attaching the release film 4. When in use, the release film 4 is peeled off to expose the glue layer 3, and the glue layer 3 is bonded to other film layers to achieve bonding.

Based on another aspect of the present disclosure, referring to FIG. 6, the present disclosure provides a flexible display panel, including a back film 1, a flexible substrate layer 5, an array structure layer 6, a light emitting film layer 7, and an encapsulating film layer 8, arranged in a manner such that they are stacked sequentially The back film 1 includes a base material having an elastic modulus of 6 to 10 GPa and a breaking elongation of 5% to 20%. Other characteristics of the back film 1 are the same as those of the back film 1 in the above embodiments, and will not be described herein.

In another embodiment of the present disclosure, the flexible display panel is an OLED display panel.

Figure 7:
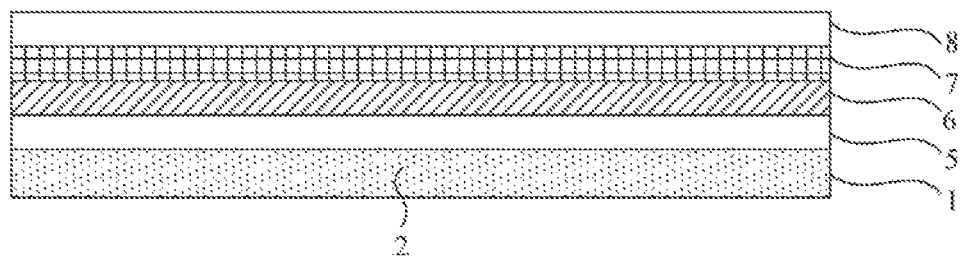
FIG. 7 is a schematic structural diagram of a flexible display panel according to an embodiment of the present disclosure.

Specifically, referring to FIG. 7, the OLED display panel may further include the flexible substrate 5 provided on the back film 1, the array structure layer 6 provided on the flexible substrate 5, the light emitting film layer 7 provided on the array structure layer 6, and the encapsulating film layer 8 provided on the light emitting film layer 7.

In a possible example of the present disclosure, referring to FIG. 5, one surface of the back film 1 is formed with the glue layer 3 and, in fabrication, the flexible substrate 5 is attached to the surface of the back film 1 on which the glue layer 3 is formed and bonded by the glue layer 3.

In another possible example of the present disclosure, referring to FIG. 1, one surface of the back film 1 is not formed with the glue layer 3 and, in fabrication, a glue layer is formed on one surface of the back film 1 or the flexible substrate 5 to bond the back film 1 and the flexible substrate 5. In another embodiment, it is also possible to form a glue layer on both surface of the back film 1 and the flexible substrate 5 to bond the back film 1 and the flexible substrate 5. Optical cement can be used for tight bonding between the other film layers.

Figure 8:
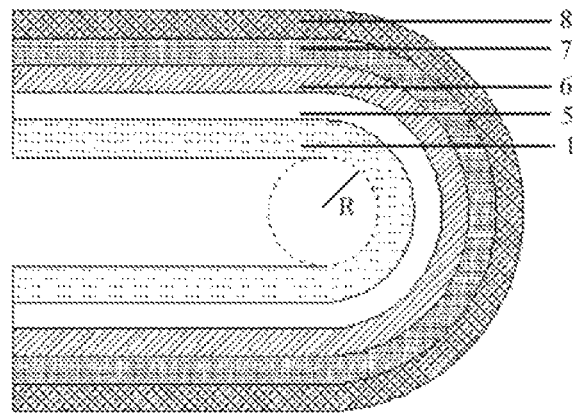
FIG. 8 is a schematic structural diagram of a flexible display panel being bent according to an embodiment of the present disclosure.
Figure 9:
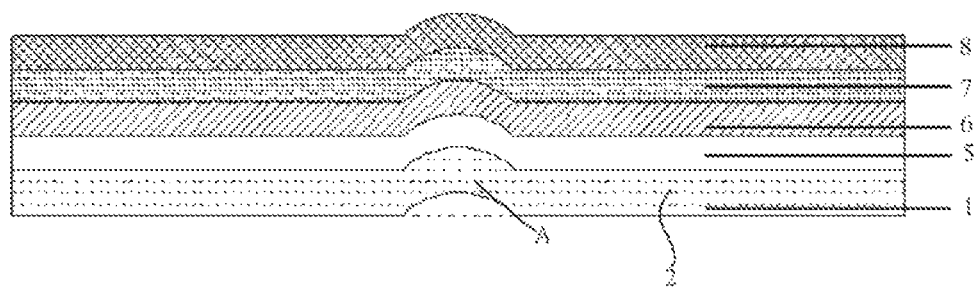
FIG. 9 is a schematic structural diagram of a flexible display panel gradually recovered after bent according to an embodiment of the present disclosure.
Figure 10:
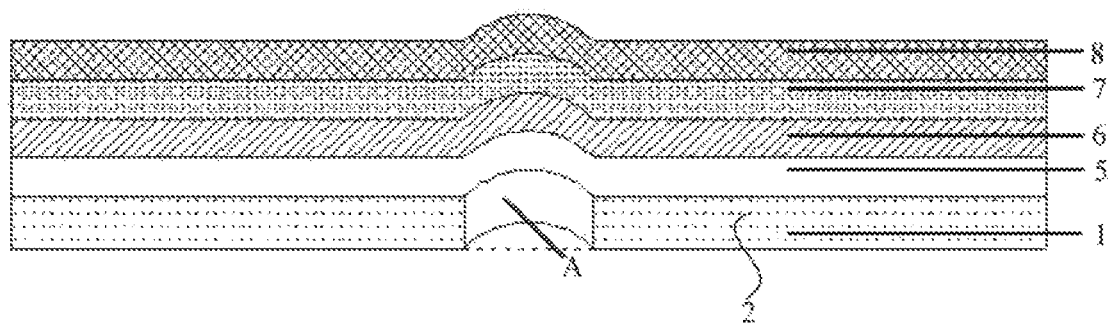
FIG. 10 is a schematic structural diagram of another flexible display panel gradually recovered after being bent according to an embodiment of the present disclosure.
Figure 11:
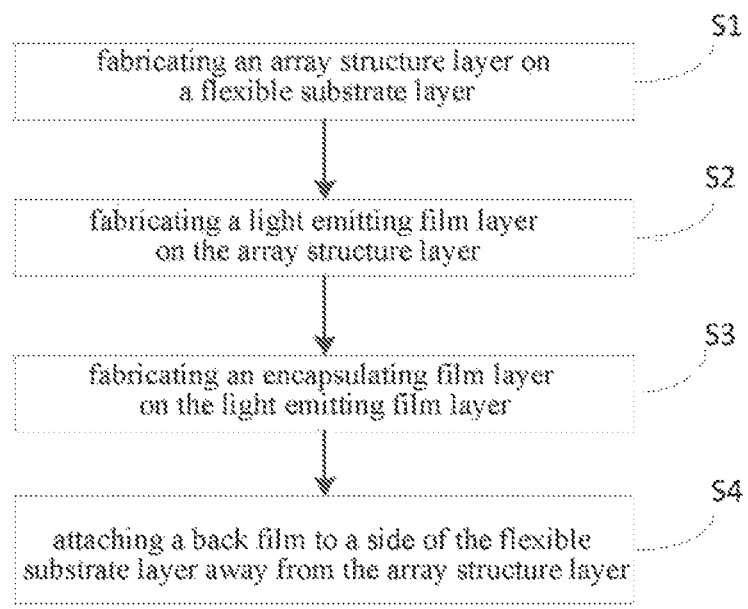
FIG. 11 is a flowchart of a method for fabricating a flexible display panel according to an embodiment of the present disclosure.

When the OLED display panel is bent, it is not cracked when its bending radius is small as R, shown in FIG. 8, and when it is unfolded, as shown in FIG. 9 and FIG. 10. After standing, the bending zone A will gradually return to flatness due to its high bending recovery performance.

The encapsulating film layer 8 may include an encapsulation film, a touch screen, an anti-reflection layer, and the like.

In another aspect of the present disclosure, the present disclosure provides a method for fabricating a flexible display panel, where steps S1-S4 are included.

In step S1, an array structure layer is fabricated on a flexible substrate layer.

In step S2, a light emitting film layer is fabricated on the array structure layer.

In step S3, an encapsulating film layer is fabricated on the light emitting film layer.

In step S4, a back film is attached to a side of the flexible substrate layer away from the array structure.

The method for fabricating the flexible substrate layer, the array structure layer, the light emitting film layer and the encapsulating film layer can be implemented by those skilled in the art based on the related art, and details are not described herein again.

The fabrication method of the above-mentioned back film is specifically: mixing the high polymer material, the inorganic nanoparticles material and the coupling agents, heating and stirring uniformly so that the inorganic nanoparticles are uniformly dispersed in the high polymer material, and then molding. The above heating and stirring may be sonicated as long as it is capable of uniformly mixing the high polymer material and the inorganic nanoparticles material, which is not limited herein.

The embodiment of the present disclosure provides a flexible display panel. Because the elastic modulus of the back film is large, the breaking elongation is small and, therefore, the back film is not easily deformed and the recovery ability is strong after bent, both the bending strength and the deformability are high, so that the bending recovery performance, the bending strength and the deformability of the flexible display panel can be improved, and cracking can be prevented when the bending radius is small.

The above is only the specific embodiments of the present disclosure, but the scope of the present disclosure is not limited thereto, and any changes or substitutions that are obvious to those skilled in the art within the scope of the present disclosure are intended to be included within the scope of the present disclosure. Therefore, the scope of protection of the present disclosure should be defined by the scope of the claims.

What is claimed is:

1. A back film for a flexible display panel, wherein:
   the back film comprises a base material having an elastic modulus of 6 to 10 GPa and a breaking elongation of 5% to 20%;
   the base material comprises at least one of a polyimide resin, a modified poly(ethylene terephthalate), a rubber, and a nylon; and
   the back film comprises a bending zone and a non-bending zone, wherein inorganic nanoparticles are dispersed in the non-bending zone and not in the bending zone.

2. The back film for a flexible display panel according to claim 1, wherein the base material has an elastic modulus of 7 to 8 GPa.

3. The back film for a flexible display panel according to claim 1, wherein the inorganic nanoparticles in the back film have a mass fraction of 1% to 5%.

4. The back film for a flexible display panel according to claim 1, wherein the inorganic nanoparticles comprise a mixture of one or more of silicon dioxide nanoparticles, titanium dioxide nanoparticles, and alumina oxide nanoparticles.

5. The back film for a flexible display panel according to claim 1, wherein the inorganic nanoparticles in the non-bending zone have a mass fraction of 1% to 5%.

6. The back film for a flexible display panel according to claim 1, wherein the inorganic nanoparticles comprise a mixture of one or more of silicon dioxide nanoparticles, titanium dioxide nanoparticles, and alumina oxide nanoparticles.

7. The back film for a flexible display panel according to claim 6, wherein a glue layer is formed on one surface of the back film.

8. The back film for a flexible display panel according to claim 7, wherein the glue layer is an acrylic pressure sensitive glue layer.

9. The back film for a flexible display panel according to claim 8, wherein a thickness of the glue layer is 10 μm to 30 μm.

10. The back film for a flexible display panel according to claim 8, the back film further comprising a release film provided on a surface of the glue layer.

11. The back film for a flexible display panel according to claim 1, wherein the base material has a moisture absorption rate of 2% or less.

12. The back film for a flexible display panel according to claim 1, wherein a thickness of the back film is 20 μm to 70 μm.

13. A flexible display panel, comprising:
    a back film, a flexible substrate layer, an array structure layer, a light emitting film layer, and an encapsulating film layer which are arranged in a manner stacked sequentially, wherein:
    the back film comprises a base material having an elastic modulus of 6 to 10 GPa and a breaking elongation of 5% to 20%;
    the base material comprises at least one of a polyimide resin, a modified poly(ethylene terephthalate), a rubber, and a nylon; and
    the back film comprises a bending zone and a non-bending zone, wherein inorganic nanoparticles are dispersed in the non-bending zone and not in the bending zone.

14. The flexible display panel according to claim 13, wherein the flexible display panel is an OLED display panel.

15. A method for fabricating a flexible display panel, comprising:
    fabricating an array structure layer on a flexible substrate layer;
    fabricating a light emitting film layer on the array structure layer;
    fabricating an encapsulating film layer on the light emitting film layer; and
    attaching a back film to a side of the flexible substrate layer away from the array structure layer, wherein:
    the back film comprises a base material having an elastic modulus of 6 to 10 GPa and a breaking elongation of 5% to 20%;
    the base material comprises at least one of a polyimide resin, a modified poly(ethylene terephthalate), a rubber, and a nylon; and
    the back film comprises a bending zone and a non-bending zone, wherein inorganic nanoparticles are dispersed in the non-bending zone and not in the bending zone.

* * * * *